US008686735B2

(12) United States Patent
Weinerth et al.

(10) Patent No.: US 8,686,735 B2
(45) Date of Patent: Apr. 1, 2014

(54) INPUT DEVICE RECEIVER PATH AND TRANSMITTER PATH ERROR DIAGNOSIS

(75) Inventors: John Weinerth, San Jose, CA (US); Shahrooz Shahparnia, Campbell, CA (US); Vivek Pant, San Jose, CA (US); Joseph Kurth Reynolds, Alviso, CA (US)

(73) Assignee: Synaptics Incorporated, San Jose, CA (US)

( * ) Notice: Subject to any disclaimer, the term of this patent is extended or adjusted under 35 U.S.C. 154(b) by 330 days.

(21) Appl. No.: 13/028,876

(22) Filed: Feb. 16, 2011

(65) Prior Publication Data
US 2012/0207244 A1   Aug. 16, 2012

(51) Int. Cl.
G01R 31/08        (2006.01)
(52) U.S. Cl.
USPC ............ 324/519; 324/525; 324/658; 324/686
(58) Field of Classification Search
USPC ......... 324/522, 523, 527, 649, 658, 659, 665, 324/679, 686
See application file for complete search history.

(56) References Cited

U.S. PATENT DOCUMENTS

| | | | |
|---|---|---|---|
| 6,104,198 A | 8/2000 | Brooks | |
| 7,057,395 B1 | 6/2006 | Williamson | |
| 7,916,127 B2 | 3/2011 | Wang | |
| 8,253,425 B2 | 8/2012 | Reynolds et al. | |
| 8,258,797 B2 | 9/2012 | Shahparnia et al. | |
| 8,519,722 B1 * | 8/2013 | Prendergast | 324/658 |
| 2005/0040839 A1 | 2/2005 | Neaves et al. | |
| 2006/0197539 A1 | 9/2006 | Schneider et al. | |
| 2007/0030408 A1 | 2/2007 | Lin et al. | |
| 2007/0115004 A1 | 5/2007 | Mirov et al. | |
| 2007/0200831 A1 | 8/2007 | Wang | |
| 2008/0157782 A1 | 7/2008 | Krah | |
| 2008/0278453 A1 | 11/2008 | Reynolds et al. | |
| 2009/0250268 A1 | 10/2009 | Staton et al. | |
| 2010/0327882 A1 * | 12/2010 | Shahparnia et al. | 324/659 |
| 2012/0050229 A1 * | 3/2012 | Tenuta et al. | 345/178 |
| 2012/0092279 A1 | 4/2012 | Martin | |

OTHER PUBLICATIONS

"Office Action, U.S. Appl. No. 13/012,943 mailed Jul. 5, 2013, 37 pages".
Chung, You C., et al., "Capacitance and Inductance Sensors for Location of Open and Short Circuited Wires", http://www.ece.utah.edu/~ece3300/Labs/lab/Timer_diff_capacitance_sensor_IEEE-instrumentation.pdf, (Aug. 2009),1-26.

(Continued)

Primary Examiner — Huy Q Phan
Assistant Examiner — Dustin Dickinson

(57) ABSTRACT

An input device comprises a processing system coupled with a plurality of receiver paths. The processing system comprises a first capacitor and a bypass switch. The first capacitor is configured to be selectively coupled with the plurality of receiver paths. The bypass switch is configured for bypassing the first capacitor. The processing system is configured to selectively couple a first receiver path of the plurality of receiver paths with the first capacitor; acquire a measurement of a first resulting signal from at least one of the first receiver path or a second receiver path of the plurality of receiver paths while the first receiver path is coupled with the first capacitor and while the bypass switch is not bypassing the first capacitor; and determine whether the first receiver path is ohmically coupled with the second receiver path based on the measurement of the first resulting signal.

20 Claims, 8 Drawing Sheets

(56) References Cited

OTHER PUBLICATIONS

Borshchov, V. et al., "Aluminium Microcable Technology for the Alice Silicon Strip Detector: A Status Report", *8th Workshop on Electronics for LHC Experiments*, Colmar, France (Sep. 2002),144-149.

Notice of Allowance for U.S. Appl. No. 13/012,943, Mailed Nov. 19, 2013, 28 pages.

* cited by examiner

INPUT DEVICE RECEIVER PATH AND TRANSMITTER PATH ERROR DIAGNOSIS

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

An input device comprises a processing system coupled with a plurality of receiver paths. The processing system comprises a first capacitor and a bypass switch. The first capacitor is configured to be selectively coupled with the plurality of receiver paths. The bypass switch is configured for bypassing the first capacitor. The processing system is configured to selectively couple a first receiver path of the plurality of receiver paths with the first capacitor; acquire a measurement of a first resulting signal from at least one of the first receiver path or a second receiver path of the plurality of receiver paths while the first receiver path is coupled with the first capacitor and while the bypass switch is not bypassing the first capacitor; and determine whether the first receiver path is ohmically coupled with the second receiver path based on the measurement of the first resulting signal.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments of the present invention and, together with the Description of Embodiments, serve to explain principles discussed below, where like designations denote like elements, and.

DESCRIPTION OF EMBODIMENTS

The following Description of Embodiments is merely provided by way of example and not of limitation. Furthermore, there is no intention to be bound by any expressed or implied theory presented in the preceding background or brief summary, or in the following detailed description.

Overview of Discussion

Herein, various embodiments are described that provide input devices and methods that facilitate improved usability. In various embodiments described herein, the input device may be a capacitive sensing device.

Discussion begins with a description of an example input device with which or upon which various embodiments described herein may be implemented. An example processing system and components thereof are then described. The processing system may be utilized with an input device such as the capacitive sensing device, or with some other device/system. Embodiments of a receiver path and transmitter path error diagnosis circuit, which can coupled with a chosen receiver path of an input device, are described. Examples of selectable capacitance/capacitances are then described. Operation of the processing system and its components are further described in conjunction with description of some example receiver path error diagnostic circuits.

Example Input Device

Figure 1A:
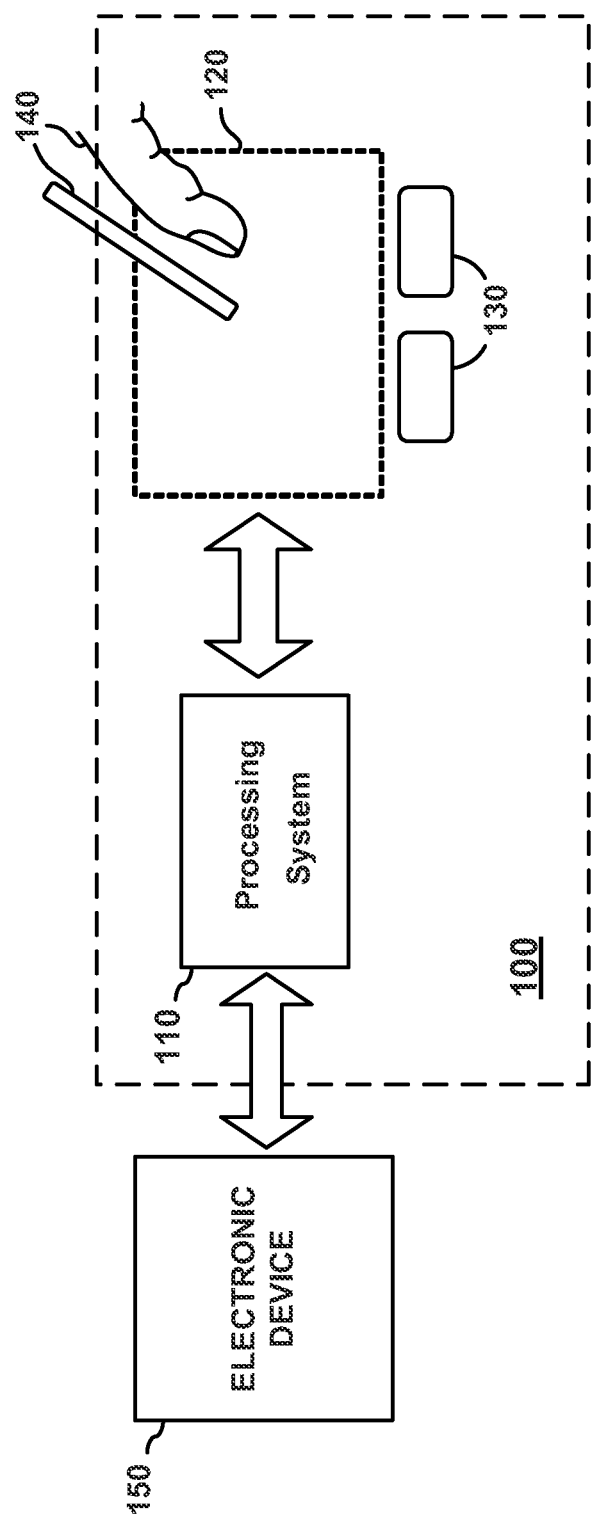
FIG. 1A is a block diagram of an example input device, in accordance with embodiments.

FIG. 1A is a block diagram of an example input device 100, in accordance with embodiments of the invention. The input device 100 may be configured to provide input to an electronic device 150. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include, but are not limited to: Inter-Integrated Circuit (I2C), Serial Peripheral Interface (SPI), Personal System 2 (PS/2), Universal Serial Bus (USB), Bluetooth,®, Radio Frequency (RF), and IRDAInfrared Data Association (IrDA).

In FIG. 1A, input device 100 is shown as a proximity sensor device (also often referred to as a "touchpad" or a "touch sensor device") configured to sense input provided by one or more input objects 110 in a sensing region 120. Some example input objects include fingers and styli, as shown in FIG. 1A.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic acoustic, ultrasonic, and/or optical techniques.

Some implementations are configured to provide images that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals comprising response(s) corresponding to the transmitter signal(s). Sensor electrodes may be dedicated transmitters or receivers, or may be configured to both transmit and receive.

In FIG. 1A, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1A shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the present invention are described in the context of a fully functioning apparatus, the mechanisms of the present invention are capable of being distributed as a program product (e.g., software in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 1B:
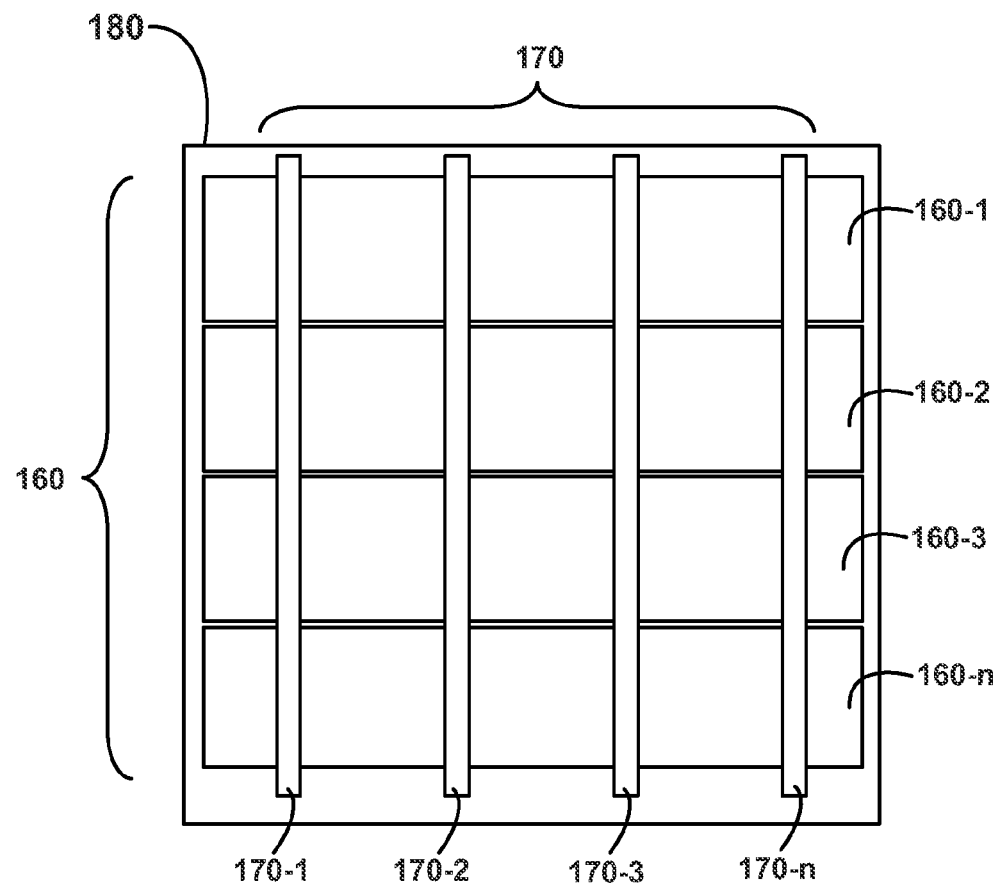
FIG. 1B shows a portion of an example sensor electrode pattern which may be utilized to generate all or part of the sensing region of an input device, according to an embodiment.

FIG. 1B shows a portion of an example sensor electrode pattern which may be disposed to generate all or part of the sensing region of an input device, according to an embodiment. For purposes of clarity of illustration and description, a simple rectangular pattern is illustrated, though it is appreciated that other patterns may be employed. The sensing pattern is made up of a plurality of receiver electrodes 170 (170-1, 170-2, 170-3, . . . 170-n) and a plurality of transmitter electrodes 160 (160-1, 160-2, 160-3, . . . 160-n) which overlay one another and are disposed on a substrate 180. In this example, touch sensing pixels are centered at locations where transmitter and receiver electrodes cross. It is appreciated that some form of insulating material is typically disposed between transmitter electrodes 160 and receiver electrodes 170. In one embodiment, transmitter electrodes 160 (160-1, 160-2, 160-3, . . . 160-n) and receiver electrodes 170 (170-1, 170-2, 170-3, . . . 170-n) may be disposed on a similar layer, where the transmitter electrode comprise a plurality of jumpers disposed on a second layer. In various embodiments, touch sensing includes sensing input objects anywhere in sensing region 120 and may comprise: no contact with any surfaces of the input device 100, contact with an input surface (e.g., a touch surface) of the input device 100, contact with an input surface of the input device 100 coupled with some amount of applied force or pressure, and/or a combination thereof.

Figure 1C:
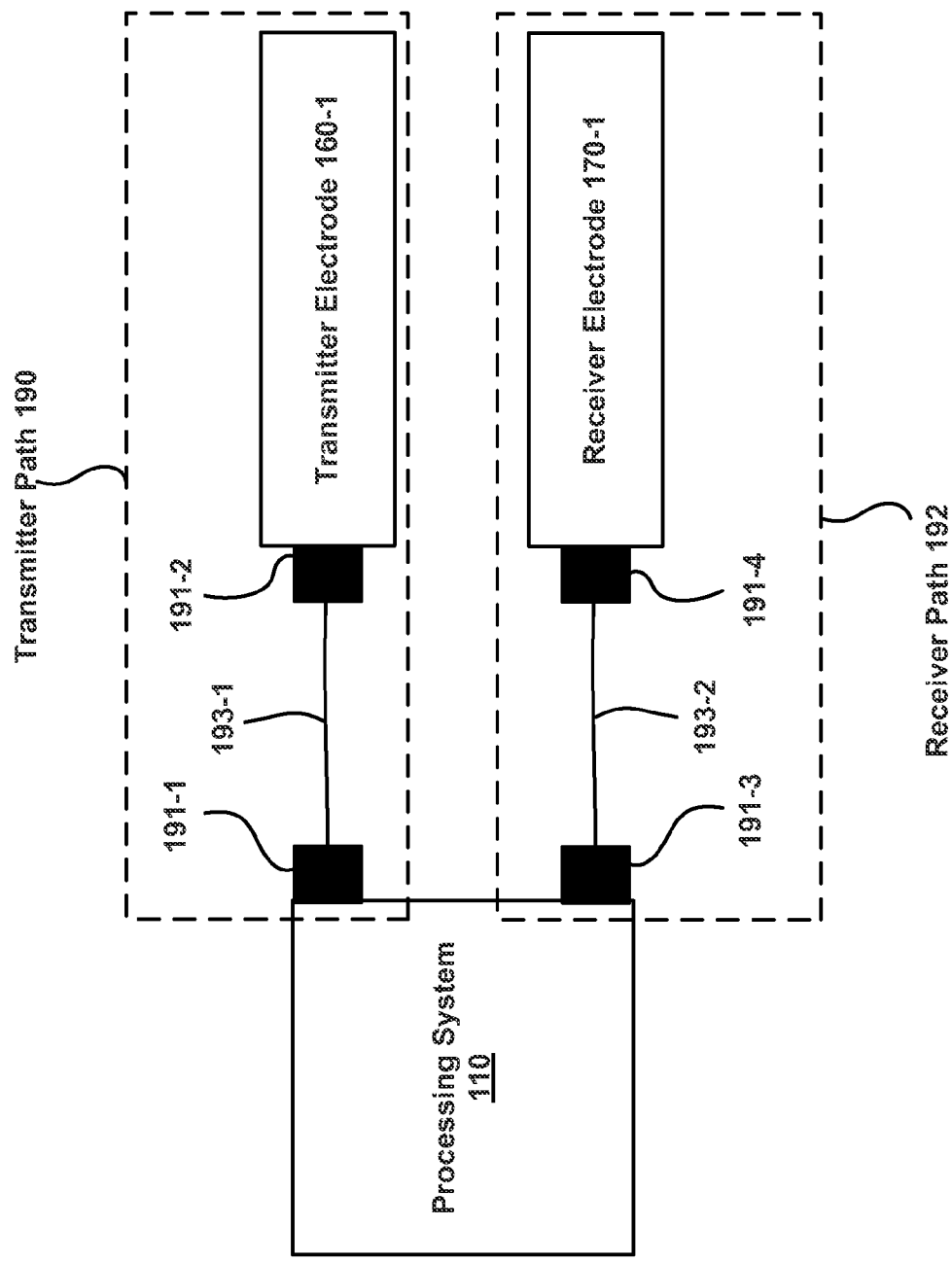
FIG. 1C shows examples of a transmitter path and receiver path, according to an embodiment.

FIG. 1C shows an embodiment of a transmitter path 190 and of a receiver path 192. As shown in FIG. 1C, transmitter path 190 may comprise a transmitter electrode (e.g., 160-1), connections 191-1 and 191-2 and trace 193-1. Receiver path 192 may comprise a receiver electrode (e.g., 170-1), connections 191-3 and 191-4 and trace 193-2, FIG. 1C shows processing system 110 coupled with trace 193-1 via connection 191-1 and trace 193-1 coupled with transmitter electrode 160-1 via connection 191-2. Further, processing system 110 is coupled with trace 193-2 via connection 191-3 and trace 193-2 is coupled with receiver electrode 170-1 via connection 191-4.

Herein, at its longest, a transmitter electrode along with a totality of the electrical pathway which couples the transmitter electrode to transmitter circuitry in a processing system is considered to be a transmitter path. However, in some embodiments, such as when a transmitter path error exists or when an input device is only partially assembled, a transmitter path may be shortened and/or include fewer components. Thus, as illustrated, by FIG. 1C, transmitter path 190 may comprise a transmitter electrode (e.g., 160-1), connections 191-1 and 191-2 and trace 193-1. In one embodiment, a transmitter path includes connection 191-1 and trace 193-1. In another embodiment, a transmitter path includes connection 191-1, trace 193-1 and connection 191-2. In yet a further embodiment, a transmitter path includes connection 191-1, trace 193-1, connection 191-2 and transmitter electrode 160-1. In other embodiments, the transmitter path may include other traces and connections. For example, in one embodiment, connection 191-2 may couple trace 193-1 with another trace, where that trace is then coupled with transmitter electrode 160-1 through another connection. In such an embodiment, transmitter path 190 may include one or more of any trace, connection and transmitter electrode. Connection 191-1 and connection 191-2 may include hot bar connections, zero insertion force connections, bonding pads, and sensor channels. In other embodiments, connections 191-1 and 191-2 include any device able to couple trace 193-1 with processing system 110 or transmitter electrode 160-1.

Herein, at its longest, a receiver electrode along with a totality of the electrical pathway which couples the receiver electrode to receiver circuitry in a processing system is considered to be a receiver path. However, in some embodiments, such as when a receiver path error exists or when an input device is only partially assembled, a receiver path may be shortened and/or include fewer components. Thus, as illustrated by FIG. 1C, transmitter path 190 may comprise a transmitter electrode (e.g., 170-1), connections 191-3 and 191-4 and trace 193-2. In one embodiment, a receiver path includes connection 191-3 and trace 193-2. In another embodiment, a receiver path includes connection 191-3, trace 193-2 and connection 191-4. In yet a further embodiment, a receiver path includes connection 191-3, trace 193-2, connection 191-4 and receiver electrode 170-1. In other embodiments, the receiver path may include other traces and connections. For example, in one embodiment, connection 191-3 may couple trace 193-2 with another trace, where that trace is then coupled with receiver electrode 170-1 through another connection. In such embodiment, receiver path 192 may include one or more of any trace, connection and receiver electrode. Connection 191-3 and connection 191-4 may include hot bar connections, zero insertion force connections, bonding pads, and sensor channels. In other embodiment, connections 191-3 and 191-4 include any device able to couple trace 193-2 with processing system 110 or receiver electrode 170-1.

In various embodiments, plurality of transmitter electrodes 160 and plurality of receiver electrodes 170 are coupled to processing system 110 though a plurality of traces, where each transmitter electrode and receiver electrode is coupled to processing system 110 through a different trace. Further, in some embodiments, plurality of transmitter electrodes 160 is coupled with a first plurality of traces, and plurality of receiver electrodes 170 is coupled with a second plurality of traces, where the plurality of transmitter electrodes 160, plurality of receiver electrodes 170 and the first and second plurality of traces are disposed on substrate 180. A connection device, comprising a third and fourth plurality of traces, couples processing system 110 with a transmitter electrode of plurality of transmitter electrodes and with a receiver electrode of plurality of receiver electrodes by coupling a trace of the first plurality of traces with a corresponding trace of the third plurality of traces and a trace of the second plurality of traces with a corresponding trace of the fourth plurality of traces. Each of the third and fourth plurality of traces is then coupled with a different connection of processing system 110. In such an example, the transmitter path may include at least one of a transmitter electrode, a corresponding trace of the first plurality of traces, a corresponding trace of the third plurality of traces, the connection between corresponding traces, and the connection between the corresponding trace of the third plurality of traces and the transmitter circuitry of processing system 110. Further, the receiver path may include at least one of a receiver electrode, a corresponding trace of the second plurality of traces, a corresponding trace of the fourth plurality of traces, the connection between corresponding traces, and the connection between the corresponding trace of the fourth plurality of traces and the transmitter circuitry of processing system 110.

Figure 2A:
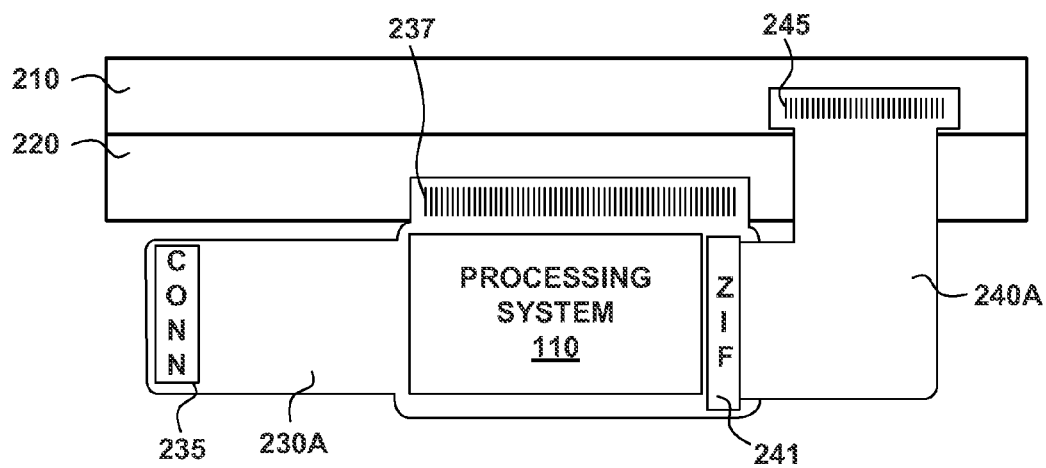
FIGS. 2A and 2B illustrate major components of receiver paths in two example input devices, in accordance with embodiments
Figure 2B:
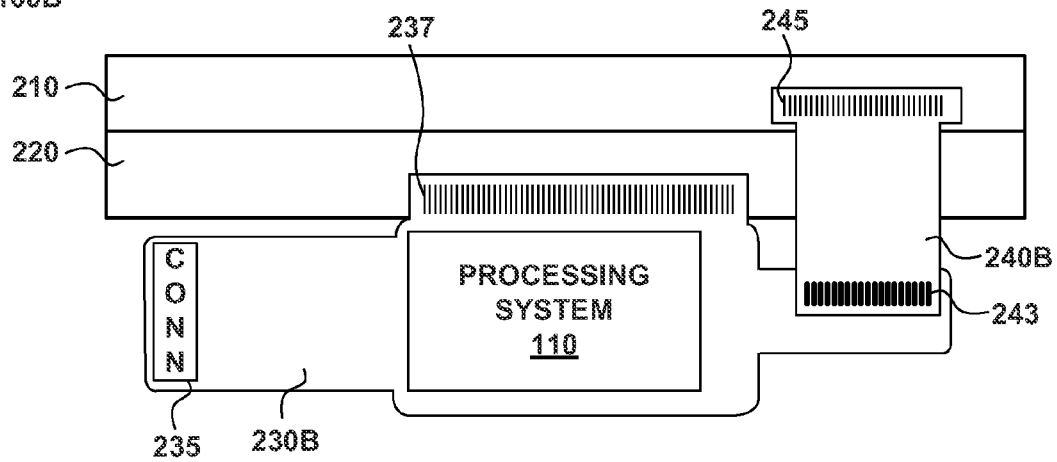

FIGS. 2A and 2B illustrate major components of transmitter paths in two example input devices, in accordance with embodiments. Input device 100A is illustrated in FIG. 2A, while input device 100B is illustrated in FIG. 2B. Both of these input devices 100A and 100B are illustrated as being overlaid upon a display, however, embodiments described herein may be utilized, with input devices that are not implemented in conjunction with a display. In various embodiments, input devices 100A and 100B may share elements with the display. For example, transmitter electrodes 160 may be shared between an input device (100A or 100B) and the display, where the transmitter electrodes 160 are configured for both capacitive sensing and display updating. In one embodiment, a common voltage electrode (Vcom electrode) of the display is segmented to form transmitter electrodes 160. In other embodiments, elements of input devices 100A and 100B may be disposed within the display such as being disposed on a polarizer, color filter panel or other substrate of the display. In one embodiment, transmitter electrodes 160 and receive electrodes 170 may be disposed on a same layer of a substrate or on different layers of a substrate: the substrate overlaid upon a display.

Input device 100A includes a clear transcapacitive touch screen 210 that is configured with a sensor electrode pattern of transmitter electrodes 160 and receiver electrodes 170 (see e.g., FIG. 1B for one example of such a sensor electrode pattern). In many embodiments, the sensor electrodes are made of transparent materials and/or are only accessible on one end. As illustrated, touch screen 210 is disposed upon a glass shelf of a thin film transistor (TFT) glass 220 of a display. Processing system 110 is disposed, upon flexible printed circuit (FPC) board 230A. FPC 230A includes a connector 235 for connecting to other electronic devices electronic device 150), a connector 237 for coupling with components a display, and first portion (e.g., a socket) of a zero insertion force (ZIF) connection 241 for removably coupling with FPC 240A. FPC 240A includes a second portion (e.g., pins that are configured to fit into the ZIF socket) of ZIF connection 241, and a connector 245 that couples with transmitter electrodes 160 and receiver electrodes 170 of touch screen 210. Between the second portion of ZIF 241 and connector 245, FPC 240A includes traces that couple transmitter circuitry of processing system 110 with transmitter electrodes 160 and traces that couple receiver circuitry of processing system 110 with receiver electrodes 170. In one embodiment, traces on FTC 240A couple to traces on touch screen 210 that are then coupled to the transmitter and receiver electrodes.

In FIG. 2A, components that make up a receiver path include: a receiver circuit of processing system 110, ZIF connection 241, a receiver trace on flexible printed circuit 240A, connector 245, and a receiver electrode (e.g., 170-1) on touch screen 210, in other embodiments, a receiver path may farther include traces on touch screen 210. An ohmic coupling (a short of some level), such as from one receiver path to another receiver path, can occur at any location in a receiver path, and embodiments described herein may be utilized to diagnose the presence such an ohmic coupling. A discontinuity (e.g., an open of some level) can occur in a receiver path, and embodiments described herein may be utilized to diagnose presence of such an open and to characterize it. Additionally, embodiments described herein may be utilized to determine the linearity of a response of this receiver path across a spectrum of different capacitances.

In FIG. 2A, components that make up a transmitter path include: a transmitter circuit of processing system 110, ZIF connection 241, a transmitter trace on flexible printed circuit 240A, connector 245, and a transmitter electrode 160-1) on touch screen 210. In other embodiments, a transmitter path may further include traces on touch screen 210. An ohmic coupling (a short of some level), such as from one transmitter path to another transmitter path, can occur at any location in a transmitter path, and embodiments described herein may be utilized to diagnose the presence such an ohmic coupling. A discontinuity (e.g., an open of some level) can occur in a transmitter path, and embodiments described herein may be utilized to diagnose presence of such an open and to characterize it.

In FIG. 2B, input device 100B includes a clear transcapacitive touch screen 210 that is configured with a sensor electrode pattern of transmitter electrodes 160 and receiver electrodes 170 (see e.g., FIG. 1B for one example of such a sensor electrode pattern). In many embodiments, the sensor electrodes are made of transparent materials and/or are only accessible on one end. As illustrated, touch screen 210 is disposed upon a glass shelf of a thin film transistor (TFT) glass 220 of a display. Processing system 110 is disposed upon flexible printed circuit (FPC) board 230B. FPC 230B includes a connector 235 for connecting to other electronic devices electronic device 150), a connector 237 for coupling with components a display, and pads (not visible) to which a soldered hot bar connection is made for coupling with FTC 240B. FTC 240B includes hot bar connector 243, and a connector 245 that couples with transmitter electrodes 160 and receiver electrodes 170 of touch screen 210. Between hot bar connector 243 and connector 245, FPC 210B includes traces that couple transmitter circuitry of processing system 110 with transmitter electrodes 160 and traces that couple receiver circuitry of processing system 110 with receiver electrodes 170. In one embodiment, traces on FPC 240B couple to traces on touch screen 210 that are then coupled to the transmitter and receiver electrodes.

In FIG. 2B, components that make up a receiver path include: a receiver circuit of processing system 110, hot bar connector 243, a receiver trace on flexible printed circuit 240B, connector 245, and a receiver electrode (e.g., 170-1) on touch screen 210. In other embodiments, a receiver path may further include traces on touch screen 210. It is appreciated that an ohmic coupling (a short of some level), such as to another receiver path, can occur at any location in this receiver path, and that embodiments described herein may be utilized to diagnose the presence such an ohmic coupling. A discontinuity (e.g., an open of some level) can occur in this receiver path, and embodiments described herein may be utilized to diagnose presence of such an open and to characterize it. Additionally, embodiments described herein may be utilized, to determine the linearity of a response of this receiver path across a spectrum of different capacitances.

In FIG. 2B, components that make up a transmitter path include: a transmitter circuit of processing system 110, hot bar connector 243, a transmitter trace on flexible printed circuit 240B, connector 215, and a transmitter electrode (e.g., 160-1) on touch screen 210. In other embodiments, a transmitter path may further include traces on touch screen 210. An ohmic coupling (a short of some level), such as from one transmitter to another or one transmitter path to another transmitter path, can occur, and embodiments described herein may be utilized to diagnose the presence such an ohmic coupling. A discontinuity (e.g., an open of some level) can occur in a transmitter path, and embodiments described herein may be utilized to diagnose presence of such an open and to characterize it.

Example Processing System

Figure 3:
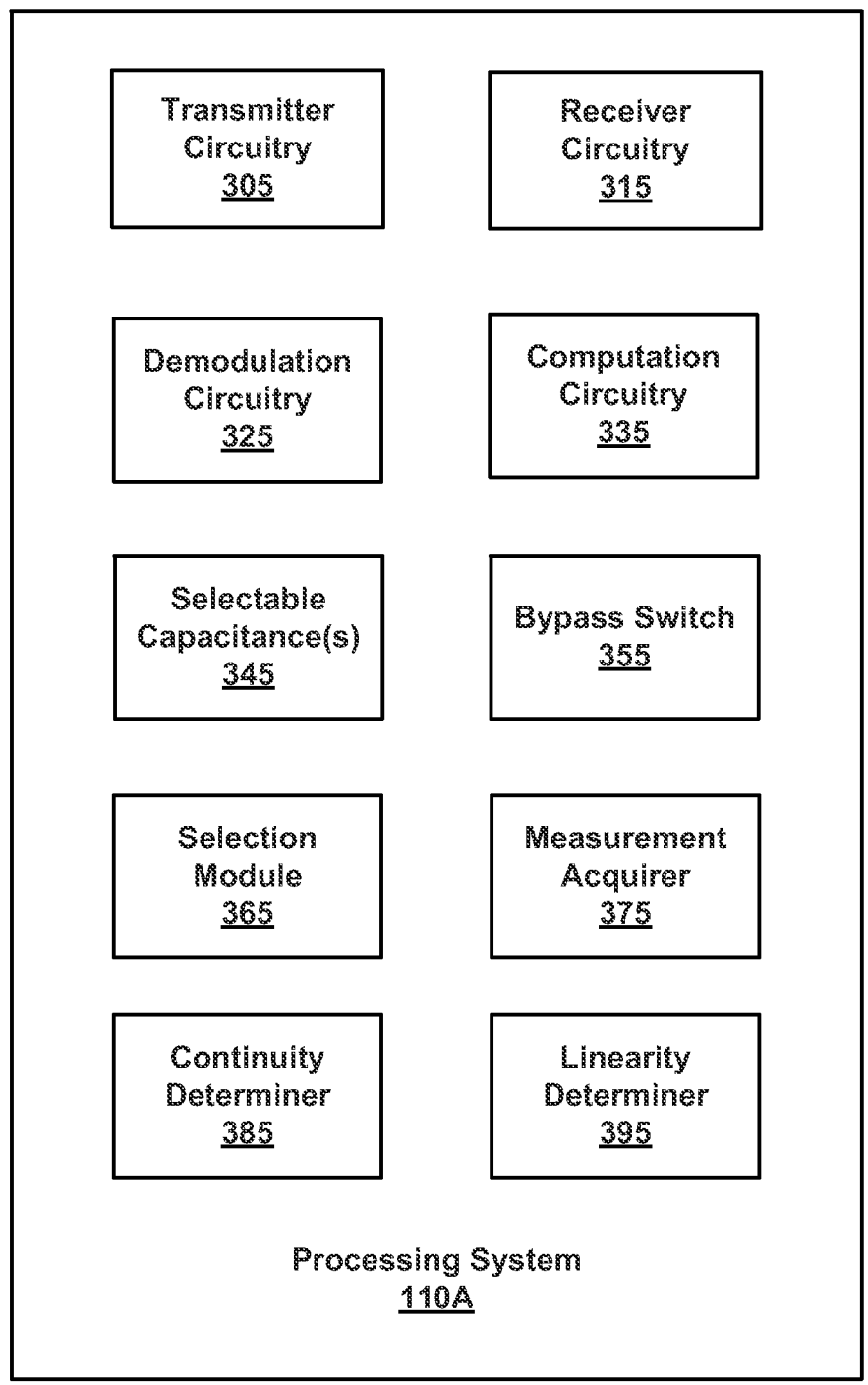
FIG. 3 illustrates an example processing system which may be utilized with an input device, according to various embodiments.

FIG. 3 illustrates an example processing system 110A which may be utilized with an input device input device 100), according to various embodiments. Processing system 110A may be implemented with one or more ASICs, one or more ICs, one or more controllers, or some combination thereof. In one embodiment, processing system 110A is communicatively coupled with a plurality of transmitter and a plurality of receiver electrodes that implement a sensing region 120 of an input device 100. In one embodiment, of input device 100, processing system 110A includes transmitter circuitry 305, receiver circuitry 315, demodulation circuitry 325, computation circuitry 335, selectable capacitance(s) 345, bypass switch 355, selection module 365 and one or more of: measurement acquirer 375, continuity determiner 385, and linearity determiner 395. In some embodiments, processing system 110A and the input device 100, of which it is a part, may be disposed in or communicatively coupled with an electronic device 150, such as a display device, computer, or other electronic device.

Transmitter circuitry 305 operates to transmit transmitter signals on one or more transmitter electrodes 160. The signals that are transmitted on the transmitter electrodes each travel to a respective transmitter electrode by way of a transmitter path. In a given time interval, transmitter circuitry 305 may transmit a transmitter signal (waveform) on one or more of a plurality of transmitter electrodes 160. Transmitter circuitry 305 may also be utilized to couple one or more transmitter electrodes 160 (and respective transmitter path(s)) of a plurality of transmitter electrodes 160 to high impedance, ground, or to a constant voltage when not transmitting a waveform on such transmitter electrodes. The transmitter signal may be a square wave, trapezoidal wave, or some other waveform.

Receiver circuitry 315 operates to receive resulting signals, via receiver electrodes. The received resulting signals correspond to and may include some version of the transmitter signal(s) transmitted via the transmitter electrodes. These transmitted transmitter signals however, may be altered or changed in the resulting signal due to stray capacitance, noise, interference, and/or circuit imperfections among other factors, and thus may differ slightly or greatly from their transmitted versions. Resulting signals may be received on one or a plurality of receiver electrodes during a time interval.

Demodulation circuitry 325 operates to demodulate the received resulting signals that are acquired from one or more receiver electrodes 170. In one embodiment, the resulting signals are or may be affected by user input. For example, the received resulting signal may be affected in amplitude, phase or frequency by a user input such as placing an input object 140 within sensing region 120.

Computation circuitry 335 operates to compute/determine a measurement of a change in transcapacitive coupling between a transmitter electrode and a receiver electrode. Computation circuitry then uses this measurement of change in transcapacitive coupling to determine the position of an input object (if any) with respect to sensing region 120. The measurement of change is determined based on the demodulated output that is acquired by demodulation circuitry 325.

Selectable capacitance(s) 345 include one or more capacitors which may be selectively coupled between a transmitter and a chosen receiver path. In one embodiment, selectable capacitance(s) may include a single capacitor which can be selectively coupled between a transmitter and a chosen receiver path of an input device, while in other embodiments, selectable capacitance(s) 345 may include two or more capacitors that can be selected in various combinations to choose a capacitance value which will be coupled between a transmitter and a receiver path of an input device.

Bypass switch 355 operates to bypass selectable capacitance(s) 345, when selectively engaged (i.e., closed). When selectively closed, bypass switch 355 creates an electrical path between a transmitter and a selected receiver path of an input device. The electrical path is in parallel with selected capacitance(s) 345 and thus bypasses selectable capacitance(s) 345, regardless of whether any capacitor of selectable capacitance(s) 345 has been selected.

Selection module 365 provides logic which can be utilized to selectively engage bypass switch 355 and/or selectable couple a capacitor or combination of capacitors of selectable capacitance(s) 345 between a transmitter and a chosen receiver path a plurality of receiver paths that exist within an input device. Selection module 365 may include or carry out one or more test routines which operate in various time periods in a predetermined manner to selectively close bypass switch 355 or selectively couple one or more capacitances between a transmitter and a chosen receiver path in order to carry out a linearity test, to determine if an ohmic coupling or discontinuity exists between the chosen receiver path and some other receiver path or portion of an input device in which the receiver path is disposed, and/or to determine if a discontinuity exists between transmitter paths of an input device in which the receiver path is disposed.

Measurement acquirer 375 operates to acquire a measurement of a first resulting signal from at least one of a first receiver path or a second receiver path of a plurality of receiver paths of an input device. For example, in one embodiment, measurement acquirer 375 acquires this measurement of the first resulting signal while a first receiver path is coupled with a transmitter (which is transmitting a transmitter signal) via a first capacitor of selectable capacitance(s) 345 and while this first capacitor is not bypassed by bypass switch 355. As will be discussed herein, measurement acquirer 375 can acquire such measurements during various time periods when various capacitances of selectable capacitance(s) 345 are coupled between a transmitter and a chosen receiver path of an input device. In one embodiment, measurement acquirer may acquire a measurement of a resulting signal on a receiver path from a receiver circuit of receiver circuitry 315. Measurement acquirer 375 may also acquire a measurement of a resulting signal while a selected receiver path is coupled to a transmitter via a closed bypass switch 355.

Continuity determiner 385 operates to determine whether a receiver path is ohmically coupled (shorted to some extent) with a second receiver path of an input device, or whether a transmitter path is ohmically coupled to another transmitter path of an input device. Such ohmic coupling determinations are based on the measurement of a resulting signal on that receiver path that is acquired by measurement acquirer 375. A selectable capacitance(s) 345 is not bypassed with bypass switch 355 when continuity determiner 385 is used to determine whether an ohmic coupling exists between receiver paths or between transmitter paths. Continuity determiner 385 also operates to determine whether an acceptable discontinuity exists in a chosen receiver path based on a comparison of a measurement of a resulting signal measured on the chosen receiver path to defined value range. The defined value range may be determined from values that have been modeled or empirically measured from a similar receiver path or paths to determine what measured value of a resulting signal constitutes an acceptable or unacceptable discontinuity (open). Selectable capacitance(s) 345 is bypassed with bypass switch 355 when continuity determiner 385 is used to determine whether an unacceptable discontinuity exists in a chosen receiver path.

Linearity Determiner 395 operates to determine a measurement of linearity of a receiver path based on a plurality of measurements of capacitance of the receiver path that are made during time periods where different capacitances are coupled between a transmitting transmitter and the receiver path. The resolution of such a linearity test is based upon the number of different capacitances values that the receiver path is tested. For example, in one embodiment, linearity determiner utilizes first, second, third, and fourth measurements of capacitance of the receiver path are taken respectively during first, second, third, and fourth time periods. In the first time period, a first capacitance provided by selectable capacitance(s) 345 is coupled between the receiver path and a transmitting transmitter. In the second time period, a second capacitance provided by selectable capacitance(s) 345 is coupled between a transmitting transmitter and the receiver path. The second capacitance is different than the first capacitance. In the third time period, a third capacitance provided by selectable capacitance(s) 345 is coupled between a transmitting transmitter and the receiver path. The third capacitance is different than the first and second capacitances. In the fourth time period, a fourth capacitance provided by selectable capacitance(s) 345 is coupled between a transmitting transmitter and the receiver path. The fourth capacitance is different than the first, second, and third capacitances. It is appreciated that, in other embodiments, different numbers of differing selectable capacitance values can be utilized.

Example Receiver Path and Transmitter Path Error Diagnosis Circuit

Figure 4A:
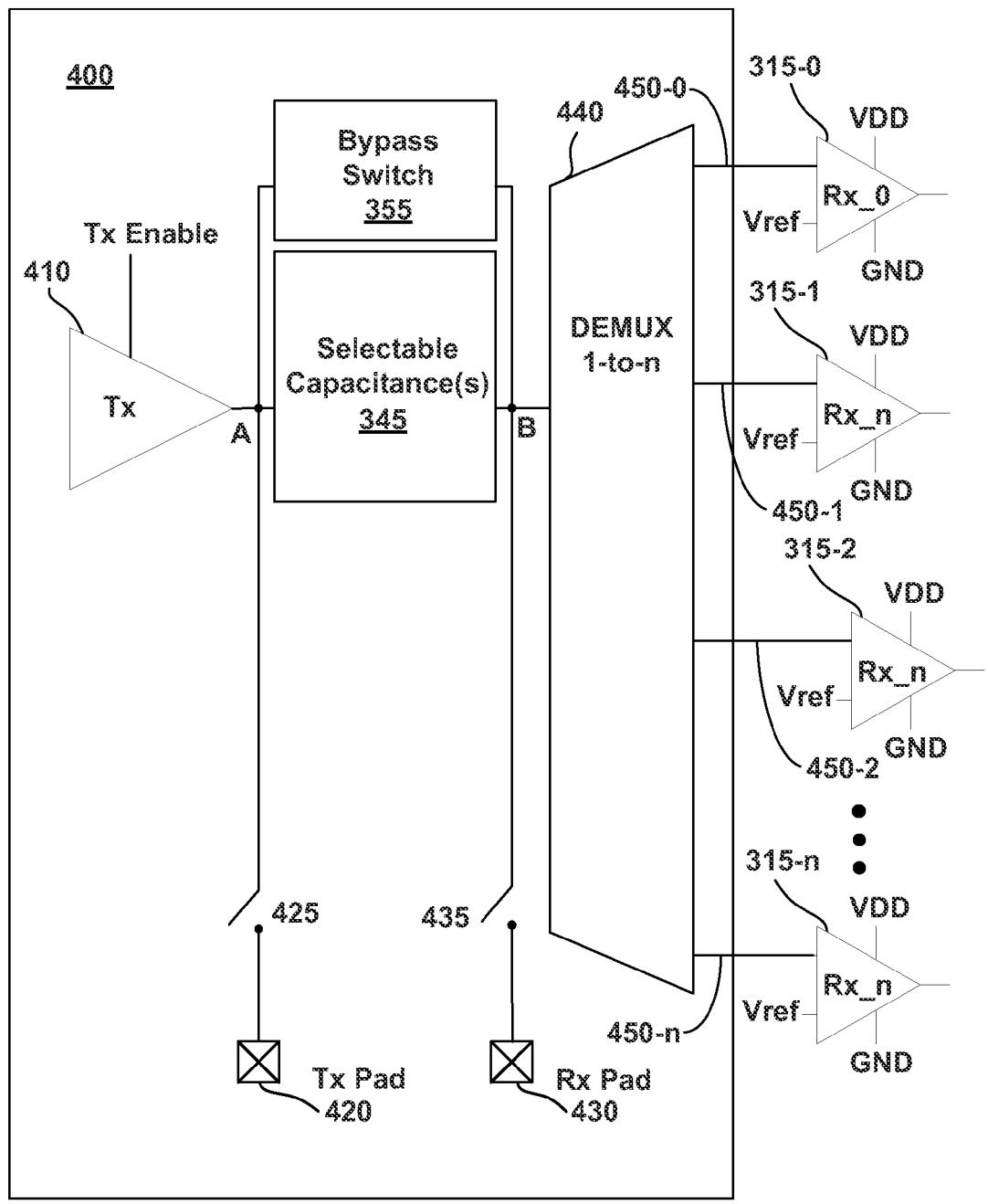
FIGS. 4A and 4B illustrate embodiments of an example receiver and transmitter path error diagnosis circuit which can coupled with a chosen receiver path of an input device, in accordance with an embodiment.
Figure 4B:
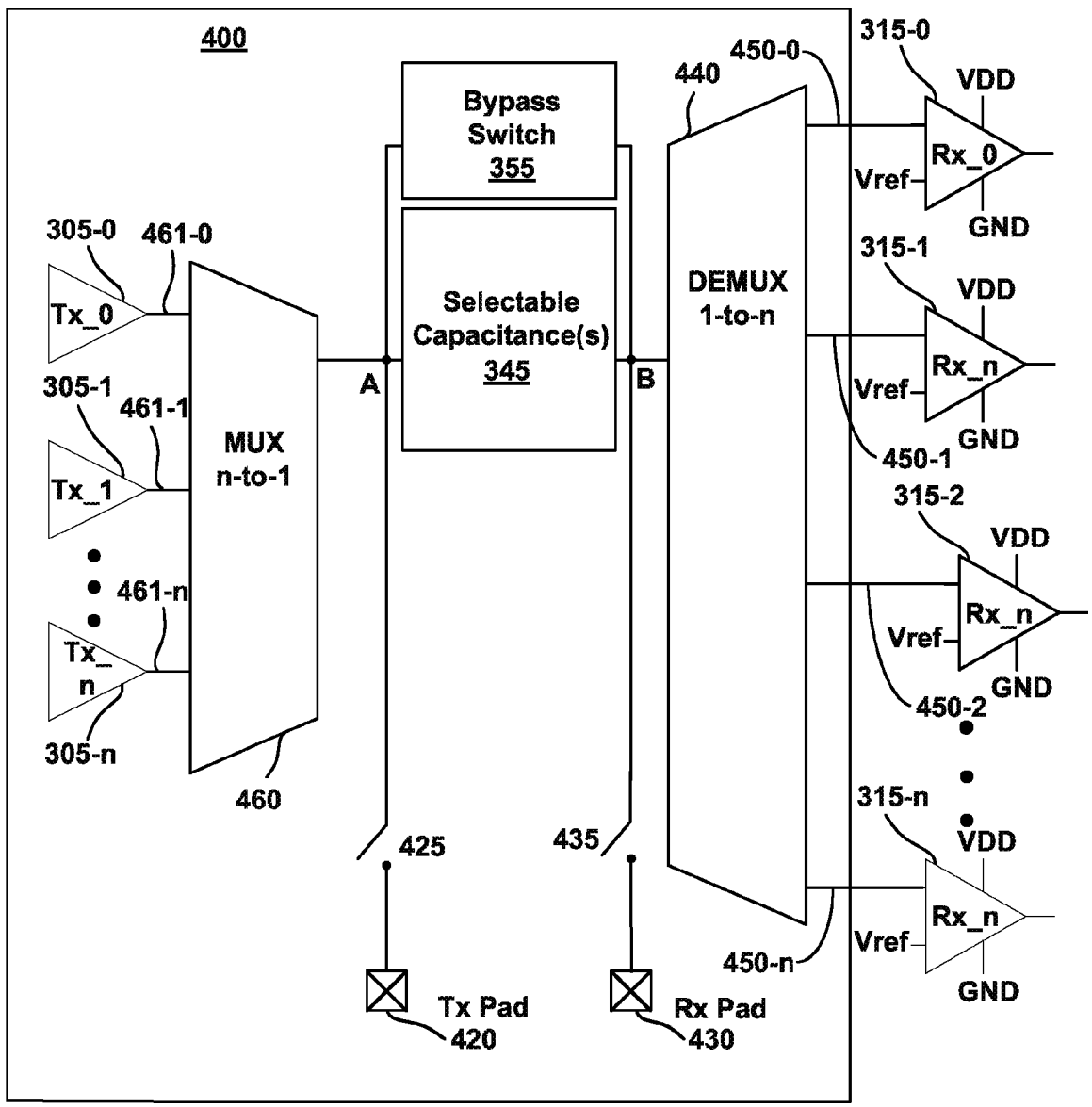

FIGS. 4A and 4B illustrate embodiments of an example receiver path and transmitter path error diagnosis circuit 400 which can coupled with a chosen receiver path 450 of an input device, in accordance with an embodiment. Circuit 400 includes transmitter (TX) 410 which can be selectively enabled and disabled via a Tx Enable input. In one embodiment, transmitter 410 is a dedicated transmitter. In another embodiment, selection module 365 or some other portion of processing system 110A controls the operation Of transmitter 110 via the Tx Enable input. As depicted, the output of transmitter 410 is coupled to node A. Node A is located, at input of bypass switch 355 and selectable capacitance(s) 345. Node A is also coupled, via selectable switch to Tx Pad 420. In some embodiments, node A may be coupled directly with Tx Pad 120, without selectable switch 425 in between. Node B is located at the output of bypass switch 355 and selectable capacitance(s) 345. In some embodiments, node B may be coupled directly with Rx Pad 430, without selectable switch 435 in between. Selection module 365 (or some other portion of processing system 110A) can be used to selectively open or close switch 125 and/or switch 435.

Node B is coupled as an input to 1-to-n demultiplexer (DEMUX) 440. Demultiplexer 440 can be controlled (e.g., by selection module 365) as a 1-to-n switch to couple node B to a chosen receiver path (e.g., receiver path 450-0) of a plurality of receiver paths 450 (e.g., 450-0, 450-1, 450-2 . . . 450-n) of an input device, such as input device 100. Receiver paths 450 are coupled with receiver circuitry 315 of processing system 110A. For example, in one embodiment, each receiver path (e.g., 450-0, 450-1, 450-2 . . . 450-n) of receiver paths 450 is coupled to a single receiver circuit (315-0, 315-1, 315-2 . . . 315-n) of receiver circuitry 315. As illustrated, in one embodiment, a receiver circuit, such as receiver circuit 315-0 has a receiver path (e.g., receiver path 450-0) coupled to a first input and a reference voltage, Vref, coupled to a second input. The reference voltage may be a voltage such as VDD/2. Rail voltages for receiver circuit 315-0 are VDD and Ground (GND). Other receiver circuits, 315-1 to 315-n, are configured in a similar fashion to 315-0, in one embodiment.

Selectable capacitance(s) 345 constitute on chip capacitance, which is disposed on the same integrated circuit with other portions of processing system 110A. TX pad 420 and RX pad 430, when included, allow the freedom to couple an arbitrary amount of off-chip capacitance between nodes A and B, and thus between a transmitter and a receiver path of an input device, such as input device 100. An off-chip capacitance can be utilized when coupled between TX pad 420 and Rx pad 430 and when switches 425 and 435 are both selectively closed. An off-chip capacitance can be utilized with selectable capacitance(s) 345 or as an alternative to selectable capacitance(s) 345.

FIG. 4B illustrates how existing transmitter circuitry 305 of a processing system, such as processing system 110A, can be coupled to node A as an alternative to or as a replacement for transmitter 410. For example, in one embodiment, individual transmitter circuits (305-0, 305-1 . . . 305-n) of transmitter circuitry 305 are coupled as inputs of n-to-1 multiplexer (MUX) 460. Each transmitter circuit is associated with a transmitter path 461 For example, transmitter circuit 305-0 is coupled with transmitter path 461-1, transmitter circuit 305-1 is coupled with transmitter path 461-1, and likewise transmitter 305-n is coupled with transmitter path 461-n. Multiplexer 460 can be controlled (e.g., by selection module 365) as an n-to-1 switch to couple node A with a chosen transmitter circuit (e.g., transmitter circuit 305-0) its respective transmitter path (e.g., 461-0), such as input device 100. In one embodiment, where existing transmitter circuitry 305 is coupled to node A, transmitter 410 is not included in circuit 400.

Example Selectable Capacitance(s)

Figure 5A:
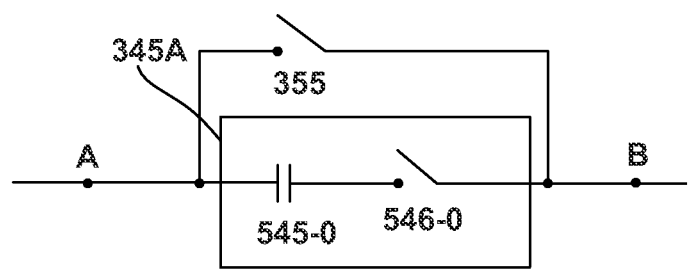
FIGS. 5A and 5B illustrate selectable capacitance(s) coupled with a bypass switch that can, when closed, bypass the selectable capacitance(s), in accordance with embodiments.
Figure 5B:
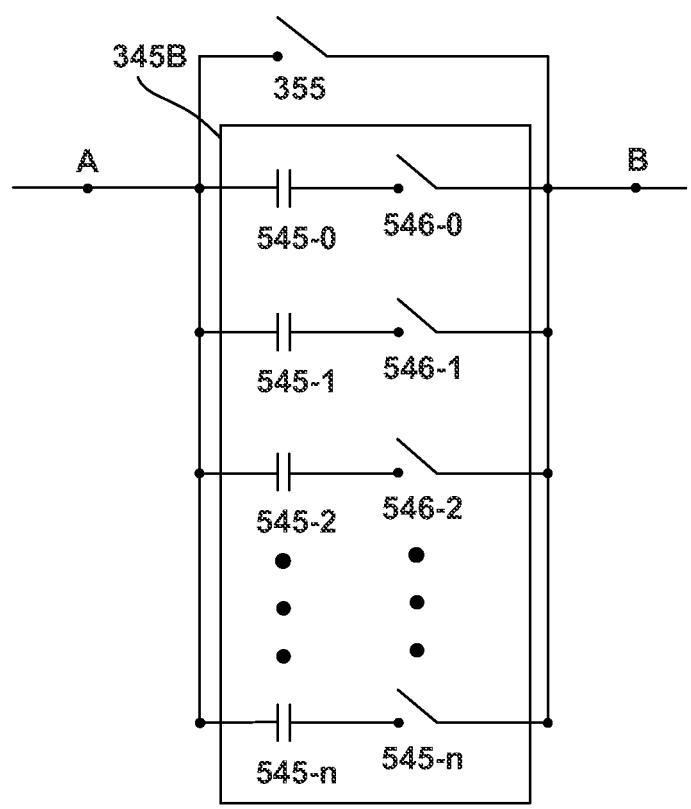

FIGS. 5A and 5B illustrate selectable capacitance(s) coupled with a bypass switch that can, when closed, bypass the selectable capacitance(s), in accordance with embodiments.

In FIG. 5A, selectable capacitance 345A is illustrated as including a single capacitor 545-0 which is selectively coupled between nodes A and B of circuit 400 by selectively opening bypass switch 355 and selectively closing capacitor select switch 546-0. Closing bypass switch 355 will create a path around, and thus bypass selectable capacitance 345A. In one embodiment, selection module 365 (or other portion of processing system 110A) is configured to selectively open and close bypass switch 355 and configured to selectively open and close capacitor select switch 546-0.

In FIG. 5B, selectable capacitances 345B is illustrated as including a plurality of capacitors 545 (545-0, 545-1, 545-2 . . . 545-n), any combination of which can be selectively coupled between nodes A and B of circuit 400 by selectively opening bypass switch 355 and selectively closing capacitor select switches 546 for selected capacitors 545 while leaving open capacitor select switches for non-selected capacitors 545. As capacitors 545 (545-0, 545-1, 545-2 . . . 545-n) are disposed in parallel to one another, selected capacitors will add to one another to form a total capacitance of selected capacitance(s) 345B. Individual capacitors 545-0, 545-1, 545-2 . . . 545-n may be of the same capacitance value or some or all may have different capacitance values from one another. Closing bypass switch 355 will create a path around, and thus bypass selectable capacitance(s) 345B and any of the capacitors 545-0, 545-1, 545-2 . . . , 545-n which might be selected. In one embodiment, selection module 365 (or other portion of processing system 110A) is configured to selectively open and close bypass switch 355 and selectively open and close capacitor select switches 546.

In one non-limiting example, capacitors 545-0, 545-1, 545-2 . . . 545-n of FIG. 5B each have a value of "N" femto Farads. In one embodiment, processing system 110A selects only capacitor 545-0 by closing only capacitor select switch 546-0 and no other capacitor select switches 546, such that selectable capacitances 345B will have a value of "N" femto Farads. In another embodiment, processing system 110A selects only capacitors 545-0 and 545-1 by closing only capacitor select switches 546-0 and 546-1 and no other capacitor select switches 546, such that selectable capacitances 345B will have a value of "2N" femto Farads. In another embodiment, processing system 110A selects only capacitors 545-0, 545-1, and 545-2 by closing only capacitor select switches 546-0, 546-1, and 546-2 and no other capacitor select switches 546, such that selectable capacitances 345B will have a value of "3N" femto Farads, yet another embodiment, processing system 110A selects only four capacitors 545-0, 545-1, 545-2, and 545-n by closing only capacitor select switches 546-0, 546-1, 546-2, and 546-n and no other capacitor select switches 546, such that selectable capacitances 345B will have a value of "4N" femto Farads.

In one embodiment, a dedicated register of processing system 110A can be associated with selectable capacitances 345B, and capacitance value can be selected by writing to this dedicated register. Selection module 365 then decodes the written information and opens and closes capacitor select switches 546 as required to obtain the desired capacitance value from selectable capacitances 345B.

Detecting Discontinuity

A processing system 110, such as processing system 110A, can be utilized to detect a discontinuity (open) in a receiver path of an input device. For example, with reference to FIG. 3, FIG. 4A, FIG. 5A, and FIG. 5B in one embodiment, selection module 365 instructs demultiplexer 440 to selectively couple receiver path 450-0 to transmitter 410 via bypass switch 355. No capacitance of selected capacitance(s) 345 is selected. While not shown in FIG. 5B, in one embodiment, any capacitors within selected capacitance(s) 345 may be shorted to ground. Receiver circuitry 315 disables receiver circuit 315-0 and enables all other receiver circuits 315-1 to 315-n. Transmitter 410 drives on what is essentially a wire that couples transmitter 410 to receiver path 450-0. Any transcapacitance between the input of disabled receiver circuit 315-0 and an input of any of the enabled receiver circuits 315-1 to 315-n can be digitized as a measurement of transcapacitance, by measurement acquirer 375, from the respective resulting signals measured from any of receiver circuits 315-1 to 315-n.

In normal operation (no shorts or opens), a minimal transcapacitance is expected to be measured, and thus some discontinuity is expected. The question is whether the discontinuity is acceptable. A threshold value for this minimal transcapacitance can be established through empirical testing or modeling. In one embodiment, a margin of error may be established around the threshold value based on the empirical testing or modeling. Any transcapacitance that is measured as within this margin of error is determined, by continuity determiner 385, to indicate that an acceptable discontinuity exists in the tested receiver path (e.g., receiver path 450-0 in the instant example). Any transcapacitance that is measured as below this margin of error is determined, by continuity determiner 385, to indicate that an unacceptable discontinuity exists in the tested receiver path (e.g., receiver path 450-0 in the instant example). In one embodiment, an unacceptable discontinuity includes an open in receiver path 192. For example, an open may exist in trace 193-3, receiver electrode 170-1 or within connection 191-3 or 191-4. In one embodiment, any transcapacitance that is measured as above this margin of error is determined, by continuity determiner 385, to indicate that indicates that an excessive interference exists between receiver circuits 315.

By cycling through all receiver paths in this manner and coupling each receiver path individually, in turn, to transmitter 110 through bypass switch 355, each receiver path can be checked for presence of an unacceptable discontinuity. For example, selection module 365 can selectively couple a second receiver path (e.g., receiver path 450-1) to transmitter 410 through bypass switch 355 in the manner previously described. While receiver circuit 315-1 is disabled an all other receiver circuits 315 are enabled, measurement acquirer 375 acquires a measurement of a resulting signal from at least one of receiver path 450-0, 450-2 or another receiver path other than receiver path 450-1. Continuity determiner then digitizes the resulting signal into a measure of transcapacitance and compares it to the threshold transcapacitance value, as described above, to determine if an acceptable or unacceptable discontinuity exists in receiver path 450-1.

A processing system 110, such as processing system 110A, can also be utilized to detect a discontinuity (open) in a transmitter path of an input device. For example, with reference to FIG. 3, FIG. 1B, and FIG. 5A in one embodiment, selection module 365 instructs demultiplexer 440 and multiplexor 460 to selectively couple receiver path 450-0 to transmitter 305-0 via bypass switch 355, in one embodiment, selection module 365 selectively closes bypass switch 355, bypassing first capacitor, 545-0. Transmitter 305-0 is then disabled (tri-stated) and the corresponding transmitter path is coupled to an electrical potential, while one or more other transmitter circuits 305 are enabled to transmit. In one embodiment, the electrical potential is provided via weak pull-up circuitry. In another embodiment, the electrical potential is provided via weak pull-down circuitry. In a further embodiment, the electrical potential may be provided via any other circuitry able to provide a known electrical potential. Receiver circuit 315-0 then measures a resulting signal from receiver path 450-0, which is acquired by measurement acquirer 375. If there is no short between the disabled transmitter and some other transmitter, then the enabled transmitters will still couple some amount of their signals over to the disabled transmitter and its associated transmitter path. In one embodiment, if the value of transcapacitance indicated by the resulting signal measured from receiver path 450-0 is very low when compared with the threshold value, then continuity determiner 385 determines there is an open in the chosen transmitter/transmitter path. In one embodiment, the threshold value may be determined empirically from modeled data. In one embodiment, "very low" would constitute a value that is less than one half of the threshold value. In other embodiments, the term "very low" may be defined differently with respect to the threshold value.

Detecting Ohmic Coupling

A processing system 110, such as processing system 110A, can be utilized to detect ohmic coupling of a receiver path to another receiver path of an input device. For example, with reference to FIG. 3, FIG. 4A, and FIG. 5B in one embodiment, selection module 365 instructs demultiplexer 440 to selectively couple receiver path 450-0 to transmitter 410 via selectable capacitance(s) 345. Selection module 365 selects a capacitance value of selectable capacitance(s) 345 by selecting a first capacitor, 545-0, and opening bypass switch 355. The selected capacitance of selectable capacitance(s) 345 is then driven by a transmitter, such as transmitter 410. In one embodiment, receiver circuitry 315 enables all receiver circuits 315-0 to 315-n.

Measurement acquirer 375 then acquires a measurement of a first resulting signal from at least one of receiver path 450-0 or another receiver path (e.g., 450-1) of the plurality of receiver paths 450. In one embodiment, each receiver path of the plurality of receiver paths 450 may be enabled to receive resulting signals. The resulting signal is measured from the output of a receiver circuit that is coupled with the receiver path. Continuity determiner 385 then determines whether receiver path 450-0 is ohmically coupled (shorted) with another receiver path 450 receiver path based on the measurement of the first resulting signal. For example, if the first resulting signal is measured on receiver path 450-0 (measured at the output of receiver circuit 315-0), the resulting signal should indicate a measure of transcapacitance that is the same as the value of the capacitance of selected capacitance(s) 345. If it is lower than expected, this is because some of the signal will have bled off (shorted to) the one or more other receiver paths to which receiver path 450-0 is ohmically coupled. For example, if the selected capacitor(s) 345 was set at to a known capacitance value, and a lower transcapacitance value was indicated when a resulting signal was measured from receiver path, then continuity determiner 385 can determine that there is an ohmic coupling to another receive path if the measured value of transcapacitance is approximately half what is expected in this example, then there is an Ohmic coupling between receiver path 450-0 and one other receiver path. If the measured value is less than half of what is expected then receiver path 450-0 is ohmically coupled with multiple other receiver paths. Similarly, if the resulting signal is measured on a receiver circuit other than 315-0, such as on receiver circuit 315-1, and any capacitance value other than zero is indicated by the measured resulting signal, then continuity determiner 385 can determine that there is an ohmic coupling between receiver path 455-0 and 450-1.

By cycling through all receiver paths in this manner and coupling selected capacitance(s) 345 to each receiver path in turn, receiver paths which have an ohmic coupling to another receiver path can be determine. For example, selection module 365 can selectively couple a second receiver path (e.g., receiver path 450-1) with the selected capacitance(s) 345 in the manner previously described. Measurement acquirer 375 then acquires a measurement of a second resulting signal from at least one of receiver path 450-1 or a third receiver path (e.g., receiver path 450-n) of the plurality of receiver paths 450 while said second receiver path (e.g., receiver path 450-1) is coupled with the selected capacitance(s) 345 and while said bypass switch 355 is open and thus not bypassing the selected capacitance(s) 345. In the same manner as described above, continuity determiner 385 can determine whether second receiver path (e.g., 450-1) is ohmically coupled with third receiver path (e.g., 450-n) based on the measurement of the second resulting signal.

A processing system 110, such as processing system 110A, can also be utilized to detect ohmic coupling of a transmitter path to another transmitter path of an input device. For example, with reference to FIG. 3, FIG. 4B, and FIG. 5A in one embodiment, selection module 365 instructs demultiplexer 440 and multiplexor 460 to selectively couple receiver path 450-0 to transmitter 305-0 via selectable capacitance(s) 345. Selection module 365 selects a capacitance value of selectable capacitance(s) 345 by selecting a first capacitor, 545-0, and opening bypass switch 355. Transmitter 305-0 is then disabled (tri-stated) and the corresponding transmitter path is coupled to an electrical potential, while one or more other transmitter circuits 305 are enabled to transmit. In one embodiment, the electrical potential is provided via weak pull-up circuitry. In another embodiment, the electrical potential is provided via week pull-down circuitry. In a farther embodiment, the electrical potential is provided via any other circuitry able to provide a known electrical potential. Receiver circuit 315-0 then measures a resulting signal from receiver path 450-0, which is acquired by measurement acquirer 375. If the value of the selected capacitance(s) 345 is indicated by a digitized transcapacitance value obtained from the resulting signal by measurement acquirer 375, then there is an ohmic coupling (short) from transmitter 305-0 and transmitter path 461-0 to another transmission transmitter/transmitter path.

Determining Linearity

A processing system 110, such as processing system 110A, can employ selectable capacitance(s) 345 to determine the linearity of receiver path. Unlike sensing an external capacitance from an input object 140 or an externally connected capacitance, selectable capacitance(s) 345 provide an accurate, internal reference capacitance to processing system 110A which faces very minimal disturbance from signal interference and also has very minimal wiring parasitic. Both of these properties offer advantages over a capacitor that is soldered off-chip or coupled between Tx pad 420 and Rx pad 430. The linearity represents a response of a receiver path across a variety of different capacitances. The more capacitances at which the response of a receiver path is determined, the greater the resolution to which the linearity of the receiver path will be known. Thus, the resolution of a linearity test is limited by the number of different capacitance values which may be selectively generated with selectable capacitance(s) 345.

Consider a non-limiting example of a linearity test that is described with reference to FIG. 3, FIG. 4A, and FIG. 5B. In one embodiment, selection module 365 instructs demultiplexer 440 to selectively couple receiver path 450-0 to transmitter 410 via selectable capacitance(s) 345 and then to sweep from a minimum to a maximum selectable capacitance. For example, in one embodiment where capacitors 545-1 to 545-n are each of the same value, selection module 365 selects a first capacitance value of selectable capacitance(s) 345 by selecting a first capacitor, 545-0, and opening bypass switch 355. The selected capacitance of selectable capacitance(s) 345 is then driven by a transmitter, such as transmitter 410, and a capacitance value is measured from the resulting signal of receiver circuit 315-0 during a first time period. This capacitance value is acquired and measured by measurement acquirer 375. During a second time period, capacitors 545-0 and 545-1 are selected and the process is repeated to acquire a second capacitance measurement from the resulting signal of receiver circuit 315-0. During a third time period, capacitors 545-0, 545-1, and 545-2 are selected and the process is repeated to acquire a third capacitance measurement from the resulting signal of receiver circuit 315-0. During a forth time period, capacitors 545-0, 545-1, 545-2, and 545-n are selected and the process is repeated to acquire a fourth capacitance measurement from the resulting signal of receiver circuit 315-0. Linearity determiner 395 then determines a measurement of linearity of receiver path 450-0 and receiver circuit 315-0 based on said first, second, third and fourth capacitance measurements.

For linearity determiner 395 to determine that the receiver path has exhibited a linear or monotonic response: the capacitance measured during the first time period should be within some threshold of the capacitive value selected during the first time period; the capacitance measured during the second time period should be twice the capacitance measured during the first time period (or not outside of a second threshold value); the capacitance measured during the third time period should be three times the capacitance measured during the first time period (or not outside of a third threshold value); and the capacitance measured during the fourth time period should be four times the capacitance measured during the first time period (or not outside of a fourth threshold value). Any other responses would cause linearity determiner 395 to determine that the receiver path has exhibited a substantially non-linear or non-monotonic response. In one embodiment, the capacitance measured may also include an offset value corresponding to the receiver path. In other embodiments, linearity determiner 395 compares the capacitance measured during consecutive time periods to determine if the receiver path has exhibited a substantially non-linear or non-monotonic response. For example, in one embodiment, linearity determiner 395 compares the capacitance measured during the first time period is compared to the capacitance measured during the second time period and determines if the difference between the two measurements is within a predetermined range. If the difference is within the predetermined range, then the receiver path may be determined to exhibit as substantially linear or monotonic response. In one embodiment, the difference between the two measurements may be compared to a threshold value to determine if the receiver path exhibits as substantially linear or monotonic response. In a further embodiment, where more than two capacitances are used, linearity determiner 395 may then compare the next pair of capacitances measured during consecutive time periods, determining if the difference between the measurements is within a predetermined range. Once the final pair of capacitances measured during consecutive time periods is compared, linearity determiner 395 may then determine if the receiver path exhibits a substantially linear or monotonic response. Linearity determiner 395 may output the results (linear/non-linear) and or the data from a linearity test for analysis.

Thus, the embodiments and examples set forth herein were presented in order to best explain various selected, embodiments of the present invention and its particular application and to thereby enable those skilled in the art to make and use embodiments of the invention. However, those skilled in the art will recognize that the foregoing description and examples have been presented for the purposes of illustration and example only. The description as set forth is not intended to be exhaustive or to limit the embodiments of the invention to the precise form disclosed.

What is claimed is:

1. An input device comprising:
   a plurality of receiver paths; and
   a processing system coupled with said plurality of receiver paths, said processing system comprising:
      a first capacitor configured to be selectively coupled with said plurality of receiver paths; and
      a bypass switch configured for bypassing said first capacitor,
   wherein said processing system is configured to:
      selectively couple a first receiver path of said plurality of receiver paths with said first capacitor;
      acquire a measurement of a first resulting signal from at least one of said first receiver path or a second receiver path of said plurality of receiver paths while said first receiver path is coupled with said first capacitor and while said bypass switch is not bypassing said first capacitor; and
      determine whether said first receiver path is ohmically coupled with said second receiver path based on said measurement of said first resulting signal.

2. The input device of claim 1, wherein said processing system further comprises a second capacitor and a third capacitor configured to be selectively coupled with said plurality of receiver paths, and wherein said bypass switch is further configured to bypass said second and third capacitors.

3. The input device of claim 1, wherein said processing system further comprises:
   a second capacitor and a third capacitor configured to be selectively coupled with said plurality of receiver paths;
   wherein said processing system is further configured to:
      couple said first receiver path to:
         a first capacitance value related to said first, second, and third capacitors during a first time period,
         a second capacitance value related to said first, second, and third capacitors during a second time period,
         a third capacitance value related to said first, second, and third capacitors during a third time period, and
         a fourth capacitance value during a fourth time period, said fourth capacitance value based on said first, second, and third capacitors;
      acquire a first capacitance measurement of said first receiver path during said first time period, a second capacitance measurement of said first receiver path during said second time period, a third capacitance measurement of said first receiver path during said third time period, and a fourth capacitance measurement of said first receiver path during said fourth time period; and
      determine a measurement of linearity of said first receiver path based on said first, second, third and fourth capacitance measurements of said first receiver path.

4. The input device of claim 1, wherein said processing system is further configured to:
   selectively couple said second receiver path with said first capacitor;
   acquire a measurement of a second resulting signal from at least one of said second receiver path or a third receiver path of said plurality of receiver paths while said second receiver path is coupled with said first capacitor and while said bypass switch is not bypassing said first capacitor; and
   determine whether said second receiver path is ohmically coupled with said third receiver path based on said measurement of said second resulting signal.

5. The input device of claim 1, wherein said processing system is further configured to:
   selectively configure said bypass switch to bypass said first capacitor;
   drive a transmitter signal onto said first receiver path;
   acquire a measurement of a second resulting signal on said second receiver path of said plurality of receiver paths while driving said transmitter signal through said bypass switch and onto said first receiver path and while said bypass switch is bypassing said first capacitor; and
   determine whether an acceptable discontinuity exists in said first receiver path based on a comparison of said measurement of said second resulting signal to a defined value range.

6. The input device of claim 1, wherein said processing system is further configured to:
   couple a first transmitter path of a plurality of transmitter paths with an electrical potential, wherein said processing system is coupled to said plurality of transmitter paths;
   transmit with a second transmitter path of said plurality of transmitter paths while said first transmitter path is electrically floating;
   selectively couple said first capacitor with said first receiver path;
   acquire a measurement of a second resulting signal from said first receiver path while coupling said first transmitter path with said electrical potential and while transmitting with said second transmitter path; and
   determine whether an ohmic coupling exists between said first transmitter path and said second transmitter path based on said measurement of said second resulting signal.

7. The input device of claim 1, wherein said processing system is further configured to:
   bypass said first capacitor;
   couple a first transmitter path of a plurality of transmitter paths with an electrical potential, wherein said processing system is coupled to said plurality of transmitter paths;
   transmit with a second transmitter path of said plurality of transmitter paths while said first transmitter path is electrically floating;
   acquire a measurement of a second resulting signal from said first receiver path while coupling said first transmitter path with said electrical potential and while transmitting with said second transmitter path; and
   determine whether an acceptable discontinuity exists within said first transmitter path based on said measurement of said second resulting signal.

8. A processing system comprising:
   a selection module configured for selectively bypassing a first capacitor and for selectively coupling one or more receiver paths of a plurality of receiver paths with said first capacitor;
   a measurement acquirer configured for acquiring a measurement of a first resulting signal from at least one of a first receiver path or a second receiver path of said plurality of receiver paths while said first receiver path is coupled with said first capacitor and while said first capacitor is not bypassed; and a continuity determiner configured for determining whether said first receiver path is ohmically coupled with said second receiver path based on said measurement of said first resulting signal.

9. The processing system of claim 8, further comprising a linearity determiner, and wherein:
said selection module is configured for selectively coupling one or more of said first capacitor, a second capacitor, and a third capacitor to said first receiver path such that:
a first capacitance value is coupled to said first receiver path during a first time period,
a second capacitance value is coupled to said first receiver path during a second time period,
a third capacitance value is coupled to said first receiver path during a third time period, and
a fourth capacitance is coupled to said first receiver path during a fourth time period, wherein said first, second, third, and fourth capacitance values are different;
said measurement acquirer is configured for acquiring a first measurement of capacitance of said first receiver path during said first time period, a second measurement of capacitance of said first receiver path during said second time period, a third measurement of capacitance of said first receiver path during said third time period, and a fourth measurement of capacitance of said first receiver path during said fourth time period; and
said linearity determiner is configured for determining a measurement of linearity of said first receiver path based on said first, second, third, and fourth measurements of capacitance of said first receiver path.

10. The processing system of claim 8, further comprising transmitter circuitry, wherein:
said transmitter circuitry is configured for driving a transmitter signal onto said first receiver path;
said measurement acquirer is further configured for acquiring a measurement of a second resulting signal on a second receiver path of said plurality of receiver paths while said transmitter signal is driven onto said first receiver path and while said first capacitor is bypassed; and
said continuity determiner is configured for determining whether an acceptable discontinuity exists in said first receiver path based on a comparison of said measurement of said second resulting signal to a defined value range.

11. The processing system of claim 10, wherein:
said transmitter circuitry is further configured for driving said transmitter signal onto said second receiver path;
said measurement acquirer is further configured for acquiring a measurement of a third resulting signal on a third receiver path of said plurality of receiver paths while said transmitter signal is driven by said transmitter circuitry onto said second receiver path and while said first capacitor is bypassed; and
said continuity determiner is further configured for determining whether an acceptable discontinuity exists in said second receiver path based on a comparison of said third resulting signal to said defined value range.

12. The processing system of claim 8, wherein said selection module is further configured for selectively coupling either or both of a second capacitor and a third capacitor to any of said plurality of receiver paths.

13. The processing system of claim 8, wherein said selection module is configured for selectively bypassing said first capacitor by selectively closing a bypass switch.

14. The processing system of claim 8, wherein:
said selection module is configured for selectively coupling said second receiver path with said first capacitor;
said measurement acquirer is further configured for acquiring a measurement of a second resulting signal from at least one of said second receiver path or a third receiver path of said plurality of receiver paths while said second receiver path is coupled with said first capacitor and while first capacitor is not bypassed; and
said continuity determiner is further configured for determining whether said second receiver path is ohmically coupled with said third receiver path based on said measurement of said second resulting signal.

15. A processing system comprising:
a selection module configured for selectively bypassing a first capacitor and for selectively coupling one or more receiver paths of a plurality receiver paths with said first capacitor;
transmitter circuitry configured for driving a transmitter signal onto a first receiver path of said plurality of receiver paths;
a measurement acquirer configured for acquiring a measurement of a first resulting signal on a second receiver path of said plurality of receiver paths while said transmitter circuitry is driving said transmitter signal onto said first receiver path and while said first capacitor is bypassed; and
a continuity determiner configured for determining whether an acceptable discontinuity exists in said first receiver path based on a comparison of said measurement of said first resulting signal to a defined value range.

16. The processing system of claim 15, wherein said selection module is further configured to selectively couple either or both of a second capacitor and a third capacitor to any of said plurality of receiver paths.

17. The processing system of claim 15, wherein:
said transmitter circuitry is further configured for driving said transmitter signal onto said second receiver path;
said measurement acquirer is further configured for acquiring a measurement of a second resulting signal on a third receiver path of said plurality of receiver paths while said transmitter circuitry is driving said transmitter signal onto said second receiver path and while said first capacitor is bypassed; and
said continuity determiner is further configured for determining whether an acceptable discontinuity exists in said second receiver path based on a comparison of said measurement of said second resulting signal to said defined value range.

18. The processing system of claim 15, further comprising a linearity determiner, wherein:
said selection module is configured for selectively coupling one or more of said first capacitor, a second capacitor, and a third capacitor to said first receiver path such that:
a first capacitance value is coupled to said first receiver path during a first time period,
a second capacitance value is coupled to said first receiver path during a second time period,
a third capacitance value is coupled to said first receiver path during a third time period, and
a fourth capacitance value is coupled to said first receiver path during a fourth time period, wherein said first, second, third, and fourth capacitance values are different;

said measurement acquirer is further configured for acquiring a first measurement of capacitance of said first receiver path during said first time period, a second measurement of capacitance of said first receiver path during said second time period, a third measurement of capacitance of said first receiver path during said third time period, and a fourth measurement of capacitance of said first receiver path during said fourth time period; and said linearity determiner configured for determining a measurement of linearity of said first receiver path based on said first, second, third, and fourth measurements of capacitance of said first receiver path.

19. The processing system of claim 15, wherein said measurement acquirer is further configured for acquiring a measurement of a second resulting signal from at least one of said first receiver path and said second receiver path of said plurality of receiver paths while said first receiver path is coupled with said first capacitor and while said first capacitor is not bypassed; and said continuity determiner configured for determining whether said first receiver path is ohmically coupled with said second receiver path based on said measurement of said second resulting signal.

20. The processing system of claim 19, wherein said measurement acquirer is further configured for acquiring a measurement of a third resulting signal from at least one of said second receiver path and a third receiver path of said plurality of receiver paths while said second receiver path is coupled with said first capacitor and while said first capacitor is not bypassed; and said continuity determiner configured for determining whether said second receiver path is ohmically coupled with said third receiver path based on said measurement of said third resulting signal.

* * * * *